(12) United States Patent
Fukuzawa et al.

(10) Patent No.: US 7,307,819 B2
(45) Date of Patent: Dec. 11, 2007

(54) MAGNETORESISTIVE ELEMENT MAGNETIC HEAD, MAGNETIC RECORDING APPARATUS, AND MAGNETIC MEMORY

(75) Inventors: Hideaki Fukuzawa, Sagamihara (JP); Hiromi Yuasa, Yokohama (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/190,886

(22) Filed: Jul. 28, 2005

(65) Prior Publication Data
US 2006/0023372 A1 Feb. 2, 2006

(30) Foreign Application Priority Data
Jul. 30, 2004 (JP) ............................. 2004-224124

(51) Int. Cl.
*G11B 5/33* (2006.01)
(52) U.S. Cl. ................................. 360/324.1
(58) Field of Classification Search ............ 360/324.1, 360/324.11, 324.2, 314, 324; 324/252; 428/811; 257/422
See application file for complete search history.

(56) References Cited

U.S. PATENT DOCUMENTS

| | | | |
|---|---|---|---|
| 4,258,126 A * | 3/1981 | Hiesinger | ................... 430/324 |
| 6,262,869 B1 * | 7/2001 | Lin et al. | ................ 360/324.11 |
| 6,348,274 B1 * | 2/2002 | Kamiguchi et al. | .......... 428/811 |
| 6,519,123 B1 | 2/2003 | Sugawara et al. | |
| 6,667,616 B1 * | 12/2003 | Shukh et al. | ................ 324/252 |
| 6,687,099 B2 | 2/2004 | Nakatani et al. | |
| 6,710,984 B1 | 3/2004 | Yuasa et al. | |
| 6,807,034 B2 * | 10/2004 | Hasegawa et al. | ........ 360/324.2 |
| 6,967,386 B2 * | 11/2005 | Mizuguchi | ................... 257/422 |
| 7,054,119 B2 * | 5/2006 | Sharma et al. | ............ 360/324.2 |
| 2003/0063415 A1 * | 4/2003 | Hasegawa et al. | ...... 360/324.11 |
| 2003/0104249 A1 | 6/2003 | Okuno et al. | |
| 2003/0184919 A1 * | 10/2003 | Lin et al. | ..................... 360/314 |

FOREIGN PATENT DOCUMENTS

| | | |
|---|---|---|
| CN | 1503229 A | 6/2004 |
| JP | 2000099922 A * | 4/2000 |
| JP | 2003-204095 | 7/2003 |

* cited by examiner

*Primary Examiner*—Tianjie Chen
(74) *Attorney, Agent, or Firm*—Oblon, Spivak, McClelland, Maier & Neustadt, P.C.

(57) ABSTRACT

A magnetoresistive element includes a first magnetic layer a magnetization direction of which is substantially pinned, a second magnetic layer a magnetization direction of which varies depending on an external field, a magnetic spacer layer provided between the first magnetic layer and the second magnetic layer, and electrodes which supply a current perpendicularly to a plane of a stacked film including the first magnetic layer, the magnetic spacer layer and the second magnetic layer. In this element, the magnetization directions of the first and the second magnetic layers are substantially orthogonal at zero external field.

15 Claims, 9 Drawing Sheets

MAGNETORESISTIVE ELEMENT MAGNETIC HEAD, MAGNETIC RECORDING APPARATUS, AND MAGNETIC MEMORY

CROSS-REFERENCE TO RELATED APPLICATIONS

This application is based upon and claims the benefit of priority from prior Japanese Patent Application No. 2004-224124, filed Jul. 30, 2004, the entire contents of which are incorporated herein by reference.

BACKGROUND OF THE INVENTION

1. Field of the Invention

The present invention relates to a magnetoresistive element having a structure in which a current is supplied perpendicularly to the plane of the element, as well as a magnetic head, a magnetic recording apparatus and a magnetic memory which use the magnetoresistive element.

2. Description of the Related Art

The performance of magnetic devices has drastically been improved by discovery of a giant magnetoresistive effect (GMR) in a stacked structure of magnetic films. In particular, a spin-valve film (SV film) has a structure easily applicable to a magnetic device to enable the GMR effect to be effectively produced. Consequently, the spin-valve film has brought about marked technical improvement to magnetic heads and magnetic devices such as MRAMs (Magnetic Random Access Memories).

The "spin-valve film" is a stacked film having a structure in which a nonmagnetic metal spacer layer is sandwiched between two ferromagnetic layers. In the spin-valve film, the magnetization of one ferromagnetic layer (referred to as a "pinned layer" or "magnetization pinned layer") is pinned by an antiferromagnetic layer or the like, whereas the magnetization of the other ferromagnetic layer (referred to as a "free layer" or "magnetization free layer") is made rotatable in accordance with an external field (for example, a media field). In the spin-valve film, a giant magnetoresistace change can be produced by varying the relative angle between the magnetization directions of the pinned layer and free layer.

Conventional spin-valve films are CIP (Current In Plane)-GMR elements in which a sense current is supplied parallel to the plane of the element. In recent years, much attention has been paid to CPP (Current Perpendicular to the Plane)-GMR elements (referred to as "CPP elements" hereinafter) in which a sense current is supplied substantially perpendicular to the plane of the element.

The CPP element is advantageously applicable when there is a tendency to increasingly reduce the sizes of magnetic devices. However, CPP elements using a spacer layer consisting of a nonmagnetic metal provide a very low resistance change. It is thus difficult to obtain high output signals from such a CPP element.

A new type of CPP element has been proposed which uses a spacer layer comprising an insulating layer in which nano-scaled current paths (current confined paths) consisting of a nonmagnetic material punching through the insulating layer are formed. Such a CPP element exhibits a current confined path (CCP) effect (referred to as a CCP-CPP element hereinafter) and provides high output signals than a simple CPP element using a nonmagnetic metal spacer layer. However, if the CCP-CPP element were applied to a magnetic head adapted for high density recording, the MR ratio thereof might still be insufficient.

An element that might realize an MR ratio high enough to adapt a high recording density has been proposed which has a spacer layer in which current confined paths in an oxide layer are formed of a metal magnetic material and utilizes a ballistic magnetoresistive (BMR) effect (referred to as a BMR element hereinafter). See, for example, Jpn. Pat. Appln. Publication No. 2003-204095.

However, various problems are expected to result from the formation of a fine structure that realizes ballistic conduction in an oxide thin film. For example, the current paths must be reduced to a width of at most 1 nm in order to realize ballistic conduction, resulting in high resistance. For high density recording, an increase in resistance is not preferable because it adversely affects high frequency responses. It is possible to reduce the resistance by forming a large number of fine metal paths to establish a parallel conductor state. However, at a recording density of 500 Gbpsi or more, since the element size must be at most 60 nm square, it is very difficult to fabricate a structure having a large number of fine metal paths, in such a small element region.

BRIEF SUMMARY OF THE INVENTION

A magnetoresistive element according to an aspect of the present invention comprises: a first magnetic layer a magnetization direction of which is substantially pinned; a second magnetic layer a magnetization direction of which varies depending on an external field; a magnetic spacer layer provided between the first magnetic layer and the second magnetic layer; and electrodes which supply a current perpendicularly to a plane of a stacked film including the first magnetic layer, the magnetic spacer layer and the second magnetic layer, the magnetization directions of the first and the second magnetic layers being substantially orthogonal at zero external field.

A magnetoresistive element according to another aspect of the present invention comprises: a first magnetic layer a magnetization direction of which is substantially pinned; a second magnetic layer a magnetization direction of which varies depending on an external field; a magnetic spacer layer provided between the first magnetic layer and the second magnetic layer and having a magnetic oxide with an antiferromagnetic spin alignment and bridge sections formed of a metal ferromagnetic material penetrating the magnetic oxide; and electrodes which supply a current perpendicularly to a plane of a stacked film including the first magnetic layer, the magnetic spacer layer and the second magnetic layer, the magnetization directions of the first and the second magnetic layers being substantially orthogonal at zero external field.

A magnetoresistive element according to yet another aspect of the present invention comprises: a first magnetic layer a magnetization direction of which is substantially pinned; a second magnetic layer a magnetization direction of which varies depending on an external field; a magnetic spacer layer provided between the first magnetic layer and the second magnetic layer; a biasing layer which biases a magnetization direction of the second magnetic layer; and electrodes which supply a current perpendicularly to a plane of a stacked film including the first magnetic layer, the magnetic spacer layer and the second magnetic layer, the magnetization directions of the first and the second magnetic layers being substantially orthogonal at zero external field.

A magnetic head according to the present invention comprises the above magnetoresistive element. A magnetic recording apparatus according to the present invention comprises a magnetic recording media and the above magnetic head. A magnetic memory according to the present invention comprises the above magnetoresistive element.

BRIEF DESCRIPTION OF THE SEVERAL VIEWS OF THE DRAWING

FIGS. 5A to 5C are diagrams showing the spin directions in the magnetic spacer layer in FIG. 4;

DETAILED DESCRIPTION OF THE INVENTION

For conventional BMR elements, the contribution of the BMR effect to a high MR ratio has not been physically clarified. Even discussions have been made as to whether or not the BMR effect exists actually. The inventors physically examined a phenomenon in which a high MR ratio is obtained when two magnetic layers are coupled together through a spacer layer having current confined sections in the order of nanometers formed of a magnetic material. The inventors have thus concluded that this is not caused by ballistic conduction but by a tendency with which magnetic domain walls are formed perpendicularly to current paths.

The inventors have found that, based on such a cause, it is essentially important to twist spin directions in as large a region in the spacer layer as possible and to supply a current through this region. Further, if ballistic conduction need not be taken into account, fine magnetic metal paths with a size less than 1 nm need not be formed. This makes it possible to suppress increase in resistance. Therefore, if it is possible to twist the spin directions in a large region in the spacer layer of the magnetoresistive element, a high MR ratio can be obtained, which enables to realize an increased density. However, it is difficult to twist the spin directions over a large region in the spacer layer of the magnetoresistive element. The inventors have solved this problem to attain the magnetoresistive element according to the present invention.

Figure 1:
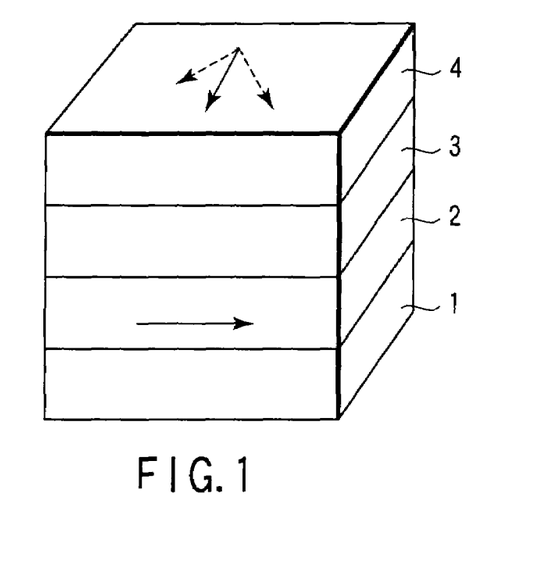
FIG. 1 is a perspective view of a major portion of a magnetoresistive element according to an embodiment of the present invention.

FIG. 1 is a perspective view showing a major portion of a magnetoresistive element according to an embodiment of the present invention. The magnetoresistive element includes a stacked film of the pinning layer 1 formed of an antiferromagnetic material or a hard magnetic material, the pinned layer (first magnetic layer) 2, the magnetic spacer layer 3, and the free layer (second magnetic layer) 4. The magnetization direction of the pinned layer 2 is substantially pinned by the pinning layer 1. Here, the expression "the magnetization direction is substantially pinned" means that the magnetization direction remains unchanged even when an external field of an intensity to be detected is applied to the element.

Figure 2A:
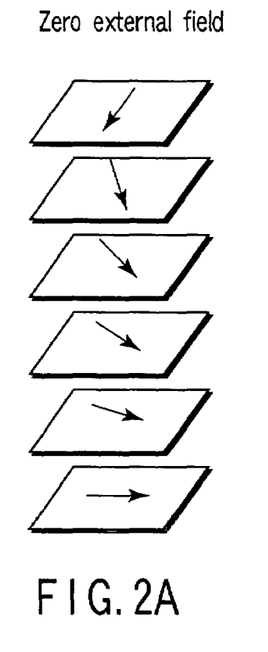
FIGS. 2A to 2C are diagrams showing the spin directions in the magnetic spacer layer in FIG. 1.
Figure 2B:
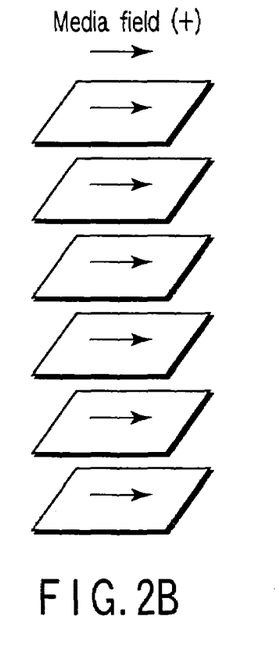
Figure 2C:
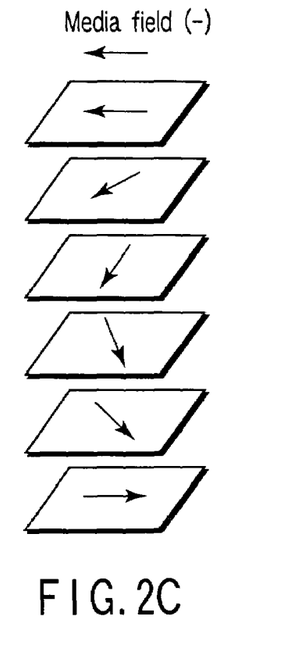

With reference to FIGS. 2A to 2C, the spin directions in the magnetic spacer layer 3 of the magnetoresistive element in FIG. 1 will be described.

As shown in FIG. 2A, at zero external field, in the magnetic spacer 3, the spin directions are twisted gradually to about 90° from a region close to the pinned layer 2 to a region close to the free layer 4. It is thus possible to make the magnetization direction of the free layer 4 substantially orthogonal to that of the pinned layer 2.

The application of an external field changes the magnetization direction of the magnetic spacer layer 3 as shown in FIGS. 2B and 2C. For example, the application of a rightward (+) external field cancels the twist of the spin directions in the magnetic spacer layer 3 as shown in FIG. 2B. This reduces the resistance caused by a current flowing through the magnetic spacer layer 3. On the other hand, the application of a leftward (−) external field markedly twists the spin directions in the magnetic spacer layer 3 as shown in FIG. 2C. This makes the magnetization direction of the pinned layer 2 antiparallel to that of the free layer 4, thus increasing the resistance caused by a current flowing through the magnetic spacer layer 3. In this manner, the external field can be used to change the twist of the spin directions in the magnetic spacer layer 3 to achieve a high MR ratio.

Three approaches are used to realize the twist of the spin directions shown in FIG. 2A in the magnetic spacer layer of the magnetoresistive element according to the embodiment of the present invention.

(1) A first approach is use of a magnetic spacer layer 3 formed of a magnetic material with an antiparallel spin alignment.

It has been known a phenomenon that, when a stacked film of two magnetic layers and an FeCo-based magnetic oxide in the order of nanometers interposed therebetween is formed, the magnetizations of the upper and lower magnetic layers are twisted by, for example, 60° or 90° if the amount of oxygen to which the FeCo-based film is exposed is increased during the formation of the magnetic oxide (H. Fukuzawa et al., J. Appl. Phys. 91, 6684 (2002)). This paper supposes that the upper and lower magnetic layers sandwiching the magnetic oxide layer are magnetically coupled and pinned so as to be used as a pinned layer. However, even in a case where one of the upper and lower magnetic layers sandwiching the magnetic spacer layer 3 is used as a free layer a magnetization direction of which varies depending on an external field and the other is used as a pinned layer a magnetization direction of which is pinned, such a twist of the spin directions as shown in FIG. 2A can be realized by applying appropriately the above phenomenon.

Figure 3A:
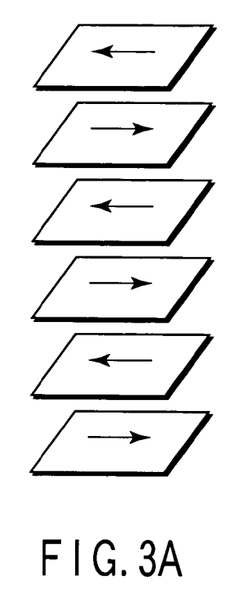
FIGS. 3A to 3C are diagrams showing the spin directions in the magnetic spacer layer in the magnetoresistive element according to another embodiment of the present invention.
Figure 3B:
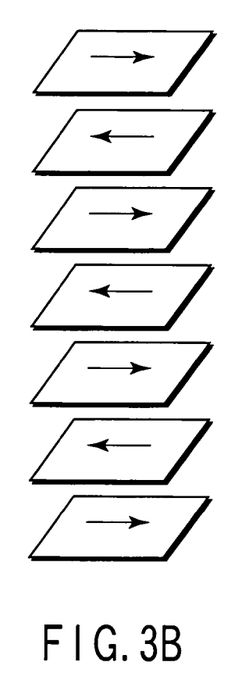
Figure 3C:
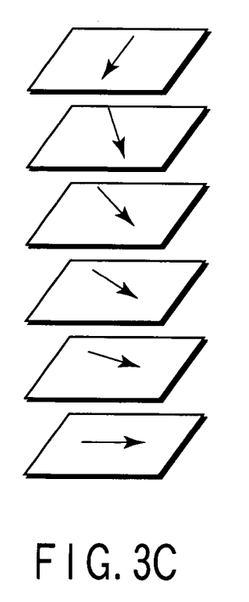

FIGS. 3A to 3C show spin directions in the magnetic spacer layer 3 formed of a magnetic material with an antiferromagnetic spin alignment. When a region with an antiferromagnetic spin alignment as shown in FIG. 3A coexists with a region with a ferromagnetic spin alignment as shown in FIG. 3B, a twist of the spin directions in the magnetic spacer layer 3 can be realized as shown in FIG. 3C as a result of the synthesis of both spin alignments. Roughness at an atomic level is a cause of presence of a region with an antiferromagnetic spin alignment and a region with a ferromagnetic spin alignment. More specifically, a region with an even number of atomic layers has the antiferromagnetic spin alignment, whereas a region with an odd number of atomic layers has the ferromagnetic spin alignment. In this case, when antiferromagnetic coupling components are equal to ferromagnetic coupling components, the magnetization direction of the free layer is twisted by 90° with respect to the magnetization direction of the pinned later as shown in FIG. 3C. If the ferromagnetic coupling components are larger than the antiferromagnetic coupling components, the angle of the twist of the spin directions can be adjusted to, for example, 60° or 30°.

(2) A second approach is use of a magnetic spacer layer 5 having a magnetic oxide 6 with an antiferromagnetic spin alignment and bridge sections 7 formed of a metal ferromagnetic material penetrating the magnetic oxide 6.

If the magnetic spacer layer can be formed completely flat without causing roughness in thickness, the number of atomic layers in the magnetic spacer layer determines whether the magnetic coupling through the atomic layers is ferromagnetic or antiferromagnetic. This prevents the coexistence of the ferromagnetic coupling and antiferromagnetic coupling.

Figure 4:
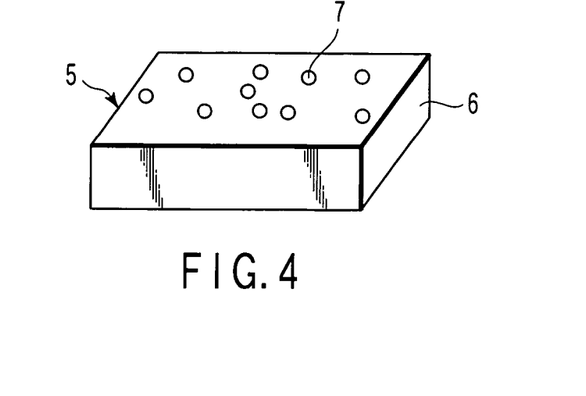
FIG. 4 is a diagram showing a magnetic spacer layer in a magnetoresistive element according to another embodiment of the present invention.

Thus, in the magnetic spacer layer 5 shown in FIG. 4, an antiferromagnetic material is used to form a magnetic oxide 6 without roughness so that the thickness of the oxide 6 corresponds to an even number of atomic layers. Further, bridge sections 7 of a metal ferromagnetic material are formed so as to penetrate the magnetic oxide 6.

Figure 5A:
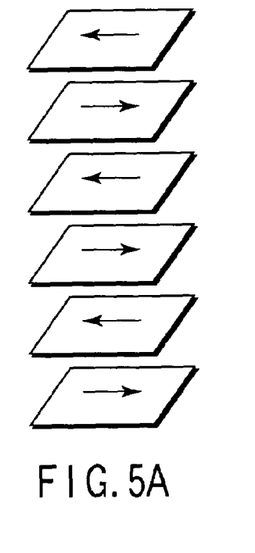
Figure 5C:
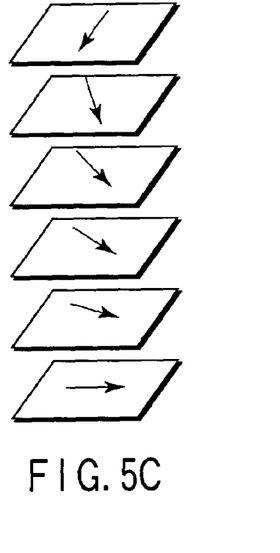

In the magnetic spacer layer 5, the magnetic oxide 6 constitutes antiferromagnetic coupling components as shown in FIG. 5A. The bridge sections 7 constitute ferromagnetic coupling components as shown in FIG. 5B. Therefore, the spin directions can be twisted as shown in FIG. 5C by appropriately adjusting the size and number (or density) of bridge sections 7.

Figure 6:
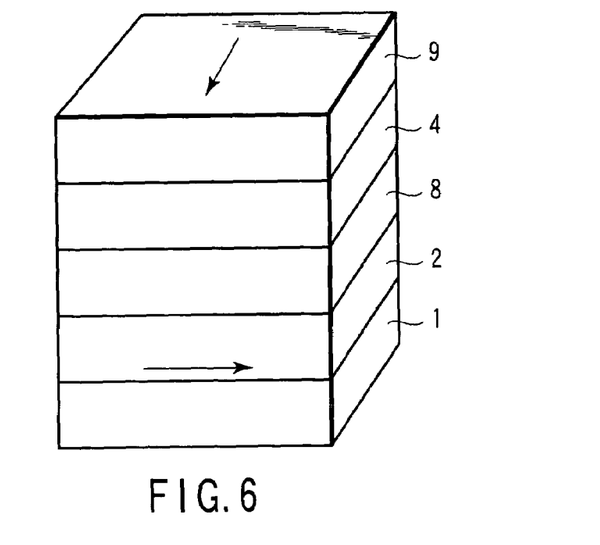
FIG. 6 is perspective view of a major portion of a magnetoresistive element according to still another embodiment of the present invention.

(3) A third approach is use of a stacked film of the pinning layer 1, the pinned layer (first magnetic layer) 2, the magnetic spacer layer 8, the free layer (second magnetic layer) 4, and the basing layer 9 as shown in FIG. 6.

Figure 7A:
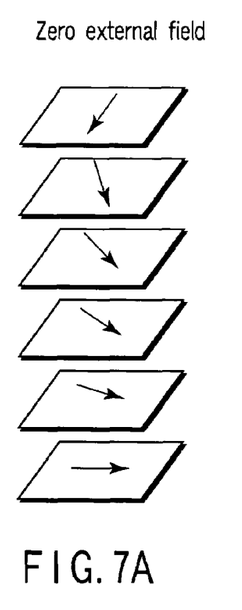
FIGS. 7A to 7C are diagrams showing the spin directions in the magnetic spacer layer in FIG. 6.

In this configuration, the magnetic spacer layer 8 is formed of a ferromagnetic material to form a ferromagnetic spin alignment in the magnetic spacer layer 8. However, since the magnetization direction of the free layer 4 intrinsically becomes the same as that in the pinned layer 2 in this configuration, the biasing layer 9 is provided to make the magnetization direction of the free layer 4 substantially orthogonal to that of the pinned layer 2. In this manner, the spin directions can be twisted by using the ferromagnetic materials for all of the pinned layer 4, magnetic spacer layer 8 and free layer 4, and the magnetization direction of the free layer 4 can be made substantially orthogonal to that of the pinned layer 2, at zero external field, as shown in FIG. 7A. The biasing field for the free layer 4 must be weaker than the pinning field for pinning the magnetization of the pinned layer 2. This is because, if this condition is not met, the magnetization of the free layer 4 is not rotated upon the application of an external field.

Figure 7B:
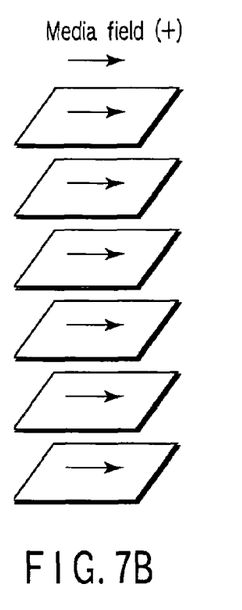
Figure 7C:
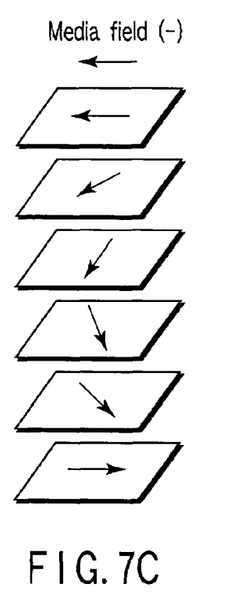

The application of a rightward (+) external field cancels the twist of the spin directions in the magnetic spacer layer 8 as shown in FIG. 7B. This reduces the resistance caused by a current flowing through the magnetic spacer layer 8. On the other hand, the application of a leftward (−) external field markedly twists the spin directions in the magnetic spacer layer 8 as shown in FIG. 7C. This makes the magnetization direction of the pinned layer 2 antiparallel to that of the free layer 4, thus increasing the resistance caused by a current flowing through the magnetic spacer layer 8. In this manner, the external field can be used to change the twist of the spin directions in the magnetic spacer layer 8 to achieve a high MR ratio.

The constitutions (1) to (3) cause a twist of the spin directions in the magnetic spacer layer between the pinned layer and free layer in the current-perpendicular-to-plane magnetoresistive element so that the twisted state of the spin directions in the magnetic spacer layer can be changed upon the application of an external field. As a result, a significantly high MR ratio can be achieved when a current is flowed through the magnetic spacer layer. Moreover, by using a magnetoresistive element having such a high MR ratio, it is possible to provide a magnetic head, a magnetic recording apparatus, and a magnetic memory which are adapted to high recording density.

Of the above constitutions (1) to (3), the constitutions (1) and (2) have the advantage that it might not be needed for the biasing structure for attaining a single domain for the free layer. That is the constitutions (1) and (2) can provide a self biasing mechanism using the weak magnetic coupling between the pinned layer and free layer sandwiching the magnetic spacer layer. Therefore, where the magnetoresistive element according to the present invention is applied to a magnetic head or a magnetic memory, the device structure is very simplified, making it possible to avoid a problem of a leakage current to a hard biasing film or an increase in costs associated with the use of a complicated structure such as an in-stack biasing structure. For MRAM, the free layer can be made into a single domain without using an extra biasing structure. This enables magnetoresistive elements to be densely arrayed to increase the density of MRAM.

EXAMPLES

Example 1

Figure 8:
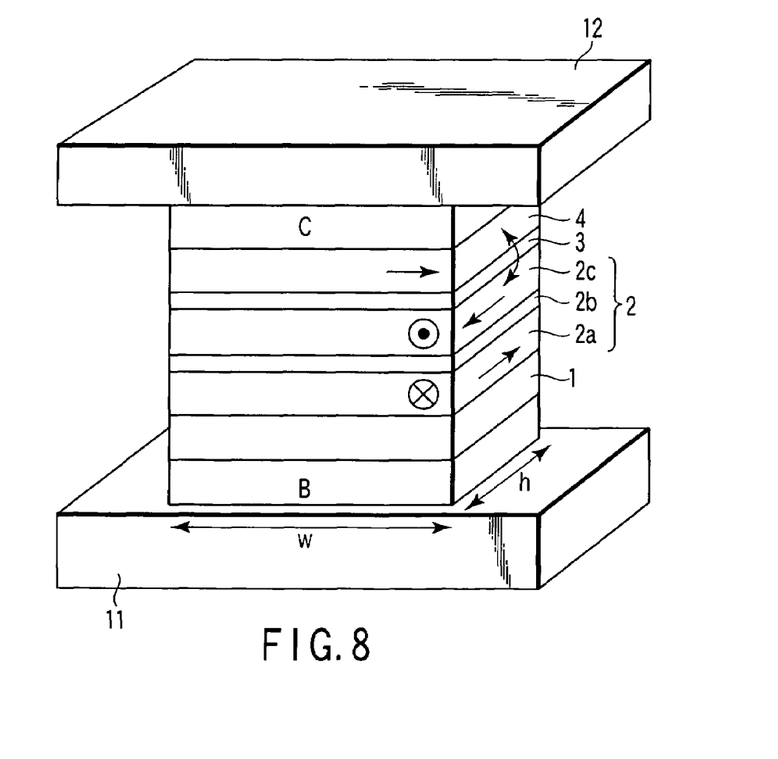
FIG. 8 is a perspective view showing a magnetoresistive element according to Example 1 of the present invention.

FIG. 8 shows an example of a current-perpendicular-to-plane magnetoresistive element using a magnetic material with an antiferromagnetic spin alignment for the magnetic spacer layer as in the case of the constitution (1). The magnetoresistive element shown in FIG. 8 has a structure in which the lower electrode 11, the buffer layer B, the pinning layer 1, the pinned layer 2 (including the first magnetic layer 2a, the Ru layer 2b, and the second magnetic layer 2c), the magnetic spacer layer 3, the free layer 4, the cap layer C, and the upper electrode 12 are stacked in this order.

In FIG. 8, the width W of the magnetoresistive element corresponds to a track width and decreases with increasing recording density. If the magnetoresistive element according to the embodiment of the present invention is applied to a magnetic head, the track width is very small, specifically, 70 to 10 nm, at a recording density of 400 Gbpsi to several Tbpsi. A sensitive magnetoresistive element is required that provides a sufficient output voltage at such a track width. The depth h of the magnetoresistive element is substantially equal to or smaller than the track width and is thus very small, specifically, 70 to 5 nm.

The pinned layer 2 and the free layer 4 are magnetically coupled through the magnetic spacer layer 3. The angle of the magnetic coupling is typically 90°. The angle may be set to 30° or 60° instead of 90°, but the angle of approximately 90° is preferable because the symmetry of resistance change brought about the application of a positive or negative media field becomes excellent.

Now, the materials used for the magnetoresistive element according to this Example will be described.

(i) The lower electrode is formed of Cu, Au, Cr, or Ta.

(ii) The buffer layer (under layer) is formed of any of the materials listed below.

A metal selected from the group consisting of Ti, Ta, W, Cr, Mo, Nb, V, Zr, and Hf or an alloy containing any of these metals [thickness: 3 nm or more and 10 nm or less], Ta [3 to 5 nm]/Ru [2 nm],
NiFeCr [3 to 5 nm],
Ta [3 nm]/NiFeCr [3 to 5 nm], and
Ta [3 nm]/NiFe [3 to 5 nm].

(iii) The pinning layer is formed of any of the materials listed below.

An antiferromagnetic layer made of IrMn, PtMn, or PdPtMn, and a hard layer made of CoPt, CoPrCr, or FePt.

(iv) The pinned layer is formed of any of the materials listed below.

Co—Fe, Ni—Fe, Ni—Co, Fe—Co—Ni, an alloy containing Co, an alloy containing Ni, an alloy containing Fe, Co, Fe, or Ni, (FeCo/Cu)×n cycles,
(CoNi/Cu)×n cycles,
(NiFe/Cu)×n cycles, and
(FeCoNi/Cu)×n cycles.

Further, an additional element may be added to these magnetic materials. The additional element includes Cu, Cr, Ti, V, Mn, Zr, Nb, Mo, Hf, Ta, W, and Pt. An FeCoCu alloy containing FeCo to which Cu is added is particularly preferable because it enhances a bulk scattering effect that is a spin-dependent scattering effect in the magnetic layer. The concentration of the nonmagnetic additional element is 1 at % or more and 50 at % or less, more preferably 2 at % or more and 20 at % or less. Further, a nitride of these metal materials may be used.

The pinned layer may consist of a single layer but is desirably a synthetic pinned layer that can substantially eliminate a net magnetic moment in order to prevent the adverse effect of a leakage field from the pinned layer. The pinned layer 2 in FIG. 8 is a synthetic pinned layer consisting of, for example, CoFe [3 nm]/Ru [1 nm]/CoFe [3 nm].

(v) The magnetic spacer layer 3 in FIG. 8 has an antiferromagnetic spin alignment and is formed of the materials described below.

An antiferromagnetic oxide: an oxide containing $\alpha\text{-Fe}_2\text{O}_3$, an oxide containing NiO, or an oxide containing $\text{CO}_3\text{O}_4$;

a spinel oxide: $MFe_2O_4$ (where M is Fe, Co, Ni, Cu, Mn, Cr, V, or Zn), or $\gamma\text{-Fe}_3\text{O}_4$;

a metal material having an antiferromagnetic spin alignment: an elemental metal of Mn, Cr, or V, or an alloy containing Mn, Cr, or V (10 atomic % or more) such as IrMn, PrMn, PdPtMn, CrMn, NiMn, RuRhMn, or RuMn (for these materials, the composition of Mn is 30 atomic % or more). An additional element such as Fe, Co, Ni, Cu, Cr, Ti, V, Mn, Zr, Nb, Mo, Hf, Ta, W, Al, or Si may be added to these materials.

Roughness should be present in the magnetic spacer layer in order to cause antiferromagnetic coupling and ferromagnetic coupling to coexist with each other in this layer. For this purpose, the magnetic spacer layer should contain two regions, a region including an even number of atomic layers and a region including an odd number of atomic layers as shown in FIG. 3.

Figure 9A:
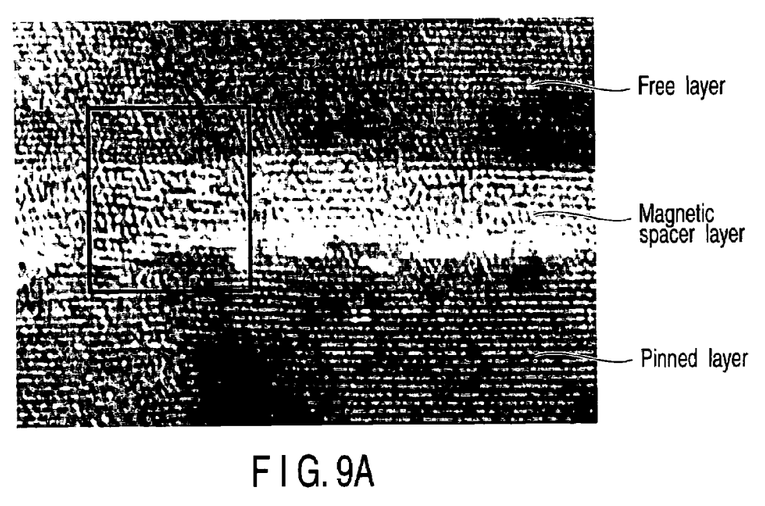
FIGS. 9A and 9B are transmission electron microscope (TEM) photographs showing a cross section of the magnetic spacer layer in the magnetoresistive element according to Example 1 of the present invention.
Figure 9B:
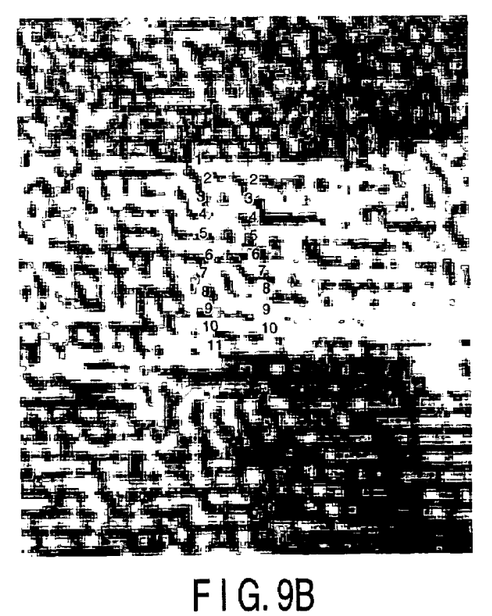

FIGS. 9A and 9B are transmission electron microscope (TEM) photographs showing cross sections of a magnetic spacer layer formed of a FeCo oxide. In FIG. 9A, the high contrast area corresponds to the magnetic spacer layer formed of the oxide. The enlarged view in FIG. 9B shows a region containing 10 (even number) atomic layers and a region containing 11 (odd number) atomic layers in the magnetic spacer layer. Such a combination of even-number layers and odd-number layers realizes the twisted structure of the spin directions in the magnetic spacer layer and the 90° coupling of the upper and lower magnetic layers sandwiching the magnetic spacer layer, on the basis of such a principle as shown FIG. 3.

Even when the magnetic spacer layer is formed of a metal antiferromagnetic material, the magnetic spacer layer can be distinguished from the pinned layer and free layer as in the case of FIG. 9. A metal layer does not have so clear a contrast difference in sectional TEM photographs as the oxide. It is thus slightly difficult to identify the metal layer. However, if the magnetic spacer layer is formed of a metal antiferromagnetic material such as IrMn or PtMn and the pinned layer and free layer are formed of fcc-CoFe, fcc-NiFe, or bcc-FeCo, the magnetic spacer layer can be distinguished from the pinned layer and free layer because IrMn and PtMn have larger lattice constants.

Further, by using a metal magnetic spacer layer containing Mn, Cr or V, it is possible to roughly determine the position of the metal magnetic spacer layer by nano EDX analysis, to calculate the lattice constant at that position, and to determine the interface between the magnetic spacer layer and the pinned layer or free layer on the basis of the position where the lattice constant changes.

(vi) The free layer is formed of any of the materials listed below.

Co—Fe, Ni—Fe, Ni—Co, Fe—Co—Ni, an alloy containing Co, an alloy containing Ni, or an alloy containing Fe, (FeCo/Cu)×n cycles,
(CoNi/Cu)×n cycles,
(NiFe/Cu)×n cycles, and
(FeCoNi/Cu)×n cycles.

A stacked film such as CoFe [1 nm]/NiFe [3 nm] may be used. An additional element may be added to the above magnetic materials. The additional element includes Cu, Cr, Ti, V, Mn, Zr, Nb, Mo, Hf, Ta, W, and t.

(vii) The cap layer is formed of any of the materials listed below.

Cu [0 to 10 nm]/Ta [1 to 5 nm], and
Cu [0 to 10 nm]/Ru [0 to 10 nm].

(viii) The upper electrode is formed of Cu, Au, Cr, or Ta similarly to the lower electrode.

The magnetoresistive element in this Example is constituted so that, at zero external field, the spin directions in the magnetic spacer layer are twisted with the magnetization direction of the free layer substantially orthogonal to that of the pinned layer. Thus, a biasing structure need not necessarily be provided which makes the free layer into a single domain.

The magnetoresistive element having the magnetic spacer layer in this Example can achieve a high MR ratio of 20 to 1,000% when an AR (area resistance) is within the range of 50 to 3,000 mΩμm². If the magnetic spacer layer is formed of a metal antiferromagnetic material based on Cr, Mn or V, a high MR can be obtained with a very low resistance because the area resistance does not increase as in the case of the use of a magnetic oxide. If the spacer layer is formed of a metal antiferromagnetic material, the range of the thickness is preferably 1 nm or more and 10 nm or less, more preferably 1 nm or more and 5 nm or less. On the other hand, if the magnetic spacer material is formed of a magnetic oxide layer, the area resistance AR is likely to increase. Accordingly, the thickness cannot be significantly increased. For a reduced resistance, the magnetic oxide layer preferably has a small thickness of 0.5 nm or more and 4 nm or less. Further, leaving a metallic additional element in the magnetic oxide in a metal state is effective in reducing the resistance. The resistance can be reduced by, for example, mixing the magnetic oxide layer with an additional element such as Fe, Co, Ni, Cu, Cr, Ti, V, Mn, Zr, Nb, Mo, Hf, Ta, W, Al, or Si in the metal state. Fe, Co, or Ni is desirable because it can reduce the resistance while maintaining the magnetism of the oxide. Moreover, Co is preferable because it is more unlikely to be oxidized than Fe and Ni and is likely to be left in the metal state.

A specific example of the magnetoresistive element shown in FIG. 8 will be described. The film configuration is as follows.

Lower electrode: Cu,
Buffer layer: Ta [5 nm]/NiFeCr [5 nm],
Pinning layer: PtMn [15 nm],
Pinned layer: CoFe [3 nm]/Ru [1 nm]/CoFe [3 nm],
Magnetic spacer layer: IrMn [2 nm],
Free layer: CoFe [1 nm]/NiFe [3 nm],
Cap layer: Cu [1 nm]/Ru [5 nm],
Upper electrode: Cu.

A method of manufacturing the magnetoresistive element will be described. Cu is deposited on a substrate and patterned to form a lower electrode. The substrate is loaded into a DC magnetron sputtering apparatus. The films from Ta in the buffer layer to Ru in the cap layer are formed under the same vacuum in deposition chambers. CoFe in the pinned layer is an appropriately oriented film which is fcc(111)-oriented and has orientation dispersion less than 5°. In this case, Fe or FeCo having a bcc structure may be used in place of CoFe sandwiched between Ru in the synthetic pinned layer and the magnetic spacer layer. Fe or FeCo having the bcc structure is an appropriately oriented film which is bcc(110)-oriented and has orientation dispersion less than 5°. IrMn, the magnetic spacer layer, is fcc(111)-oriented and has orientation dispersion less than 5°. IrMn in the magnetic spacer layer has a thickness of 2 nm. However, this thickness may be varied within the range of about 1 to 3 nm depending on the intensity of the magnetic coupling between the pinned layer and the free layer. Fluctuation similar to that shown in FIG. 9 occurs in the thickness of IrMn. Owing to the presence of regions with an even number of atomic layers and with an odd number of atomic layers, the magnetic coupling between the pinned layer and the free layer, which sandwiches the magnetic spacer layer, is at an angle of about 90°.

After the deposition processes, heat treatment is performed in a field of 10 kOe at 290° C. for four hours. The heat treatment enables ordering of PtMn pinning the pinned layer, and excellent crystal orientation in each magnetic layer. After the thermal treatment, the magnetoresistive element is processed by photolithography so that each side has a width of 100 to 30 nm. Subsequently, an upper electrode is formed. The magnetoresistive element in this Example exhibits a high MR ratio of at least 10% at an area resistance AR of 50 to 500 mΩμm².

Example 2

Another example of a current-perpendicular-to-plane magnetoresistive element will be described. The element uses a magnetic spacer layer having a magnetic oxide with an antiferromagnetic spin alignment and bridge sections penetrating the magnetic oxide and formed of a metal ferromagnetic material, as described above in (2). In this example, the configuration except for the magnetic spacer layer is similar to that of the magnetoresistive element shown in FIG. 8.

The magnetic spacer layer has a magnetic oxide with an antiferromagnetic spin alignment and bridge sections penetrating the magnetic oxide and formed of a metal ferromagnetic material. The spin alignment in the magnetic spacer layer produces antiferromagnetic coupling components in all the regions of the magnetic oxide, while producing ferromagnetic coupling components in the metal ferromagnetic bridges. The bridge section in which the ferromagnetic coupling occurs desirably has a thickness of 0.5 nm or more and 10 nm or less in the plane of the magnetic spacer layer. The reason is as follows. When the size of the bridge section exceeds 10 nm, it is too large compared to spin exchange coupling length and forms a domain. In this case, the magnetic coupling between the oxide layer and the upper and lower magnetic layers is antiferromagnetic coupling, whereas the magnetic coupling between the bridge section and the upper and lower magnetic layers is ferromagnetic coupling, and accordingly it is impossible to use the sum of both magnetic couplings. In contrast, when the size is less than 0.5 mm, very small number of, i.e., two or three, metal magnetic elements are present in the plane of the metal ferromagnetic bridge section. This precludes the production of strong ferromagnetic coupling components between the upper and lower magnetic layers.

The magnitude of magnetic coupling between the upper and lower magnetic layers and thus the MR ratio value vary depending on the size and density of the metal ferromagnetic bridge sections. The density (area ratio) of the bridge sections in the plane of the magnetic spacer layer is preferably about 1% or more and 30% or more, more preferably 3% or more and 20% or less.

In this Example, to provide good magnetic coupling through the magnetic spacer layer, the pinned layer and the free layer desirably has the fcc(111) orientation for the fcc structure, the bcc(110) orientation for the bcc structure, and an hcp(001) or (110) orientation for the hcp structure.

The crystal orientation desirably has dispersion less than 4.0°, more preferably less than 3.5°, further preferably less than 3.0°. This value is obtained by, for example, measuring a full width at half maximum of a rocking curve at a peak position obtained by θ-2θ measurements in X-ray diffraction. In the magnetic head, this value can be detected as a dispersion angle of a nano-diffraction spot in a cross section.

The method described below can be used to form a magnetic spacer layer comprising a magnetic oxide including bridge sections. For example, sputtering, MBE, CVD, or evaporation is used to form a film of a metal material constituting the bridge sections and a metal material constituting the magnetic oxide. Then, the metal material constituting the magnetic oxide is oxidized. The oxidation may be natural oxidation, radical oxidation, ion-beam oxidation, or RF plasma oxidation. To enhance oxidation activity during the oxidation, UV irradiation or substrate heating may be carried out. Ion-beam oxidation or RF plasma oxidation is preferably used in order to controllably form a magnetic oxide layer having a good crystal structure. Ion-beam oxidation may be carried out by introducing oxygen gas into an ion source or directly into an oxidation chamber. Acceleration energy for ion beams is preferably set at 30 to 100 V.

The magnetoresistive element in this Example can realize a high MR ratio of 20 to 1000% at a low AR of 60 to 1,000 $m\Omega\mu m^2$. If the magnetoresistive element in this Example is applied to a magnetic head, processing is carried out to set the width W, corresponding to the track width, to 0.1 µm or less. For a higher recording density, micro-processing is carried out to set the width W to 50 nm or less. For the depth h, processing is also carried out to such a degree that the size becomes substantially equal to the width W. If the magnetoresistive element in this Example is applied to MRAM, it is possible to use a size larger than that used for the magnetic head. Processing may be carried out so that W and h are set to 1 µm or less. In general, no biasing structure is provided, but the shape of the spin valve film is modified so as to impart uniaxial anisotropy, and enabling switching operations.

Example 3

Another example of a current-perpendicular-to-plane magnetoresistive element using a stacked film of a pinning layer, a pinned layer, a magnetic spacer layer, a free layer and a biasing layer will be described.

The biasing layer used in this Example may be a hard film or an antiferromagnetic layer. For example, a hard film containing 50% of Co, CoPt, or CoCrPt is stacked on the free layer to a thickness of 2 nm or more and 20 nm or less. Alternatively, IrMn [3 to 20 nm], PtMn [5 to 20 nm], PdPtMn [5 to 20 nm], RuMn [3 to 20 nm], or RuRhMn [3 to 20 nm] is stacked on the free layer to allow exchange coupling bias to be utilized.

The magnetic spacer layer is formed of a magnetic material so as to cause a twist of the spin directions. Specifically, it is possible to use Co, Fe, Ni, Cr, Mn, or an alloy layer containing any of these elements. FIG. 3 shows that even without a biasing layer, the spin is spontaneously twisted by the magnetic coupling action between the magnetic spacer layer and the upper and lower magnetic layers, so that the magnetization direction of the free layer is orthogonal to that of the pinned layer. However, the configuration of this Example is used if the biasing layer is used to compensate for an insufficient spontaneous twist of the spin directions or if the bias provided by the biasing layer is more stable.

Now, applications of the magnetoresistive element according to the embodiment of the present invention will be described.

Figure 10:
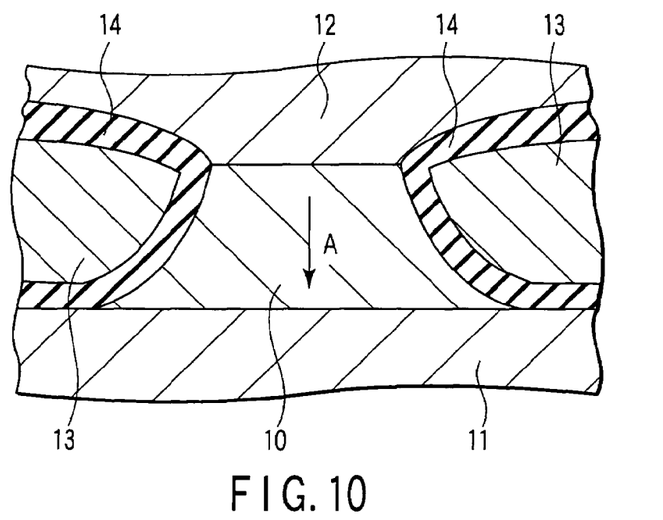
FIG. 10 is a sectional view of a magnetic head according to an embodiment of the present invention.
Figure 11:
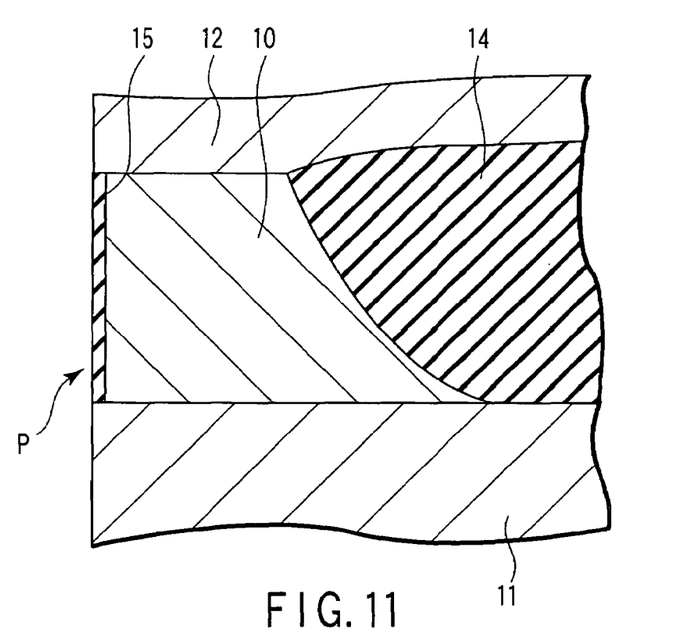
FIG. 11 is a sectional view of a magnetic head according to an embodiment of the present invention.

FIGS. 10 and 11 show the magnetoresistive element according to the embodiment of the present invention which is incorporated in a magnetic head. FIG. 10 is a sectional view of the magnetoresistive element taken along a direction substantially parallel to the air bearing surface facing a magnetic recording media (not shown). FIG. 11 is a sectional view of the magnetoresistive element taken along a direction perpendicular to the air bearing surface P.

The magnetic head shown in FIGS. 10 and 11 have a so-called hard abutted structure. The magnetoresistive element 10 has, for example, the structure shown in FIG. 1. The lower electrode 11 and the upper electrode 12 are provided under and over the magnetoresistive element 10, respectively. In FIG. 10, bias field application films 13 and insulating films 14 are stacked on the both sides of the magnetoresistive element 10. As shown in FIG. 11, a protective layer 15 is provided in the air bearing surface of the magnetoresistive element 10.

A sense current for the magnetoresistive element 10 is supplied by the electrodes 11 and 12 perpendicularly to the plane as shown by arrow A, the electrodes 11 and 12 being arranged under and over the magnetoresistive element 10. Further, the pair of bias field application films 13, 13, provided on the both sides of the magnetoresistive element 10, applies a bias field to the magnetoresistive element 10. The bias field controls the magnetic anisotropy of the free layer in the magnetoresistive element 10 to make the free layer into a single domain. This stabilizes the domain structure of the free layer. It is thus possible to suppress Barkhausen noise associated with movement of magnetic domain walls.

The present invention improves the MR ratio of the magnetoresistive element. Accordingly, the application of the present invention to a magnetic head enables sensitive magnetic reproduction.

The magnetic head shown in FIGS. 10 and 11 may be incorporated in a read and write magnetic head assembly, which can then be mounted in a magnetic recording apparatus.

Figure 12:
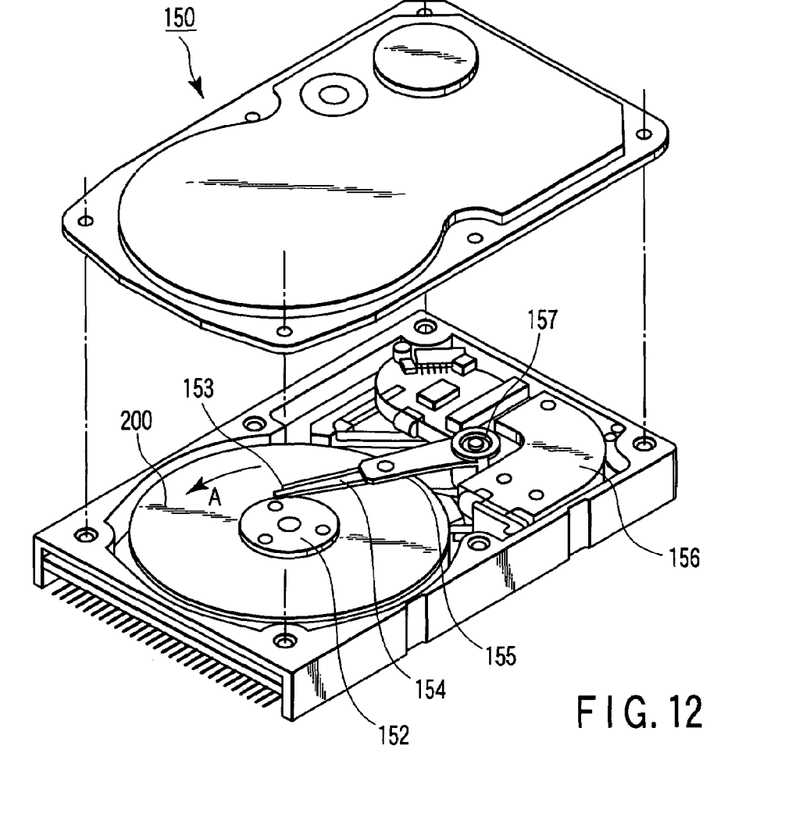
FIG. 12 is a perspective view of a magnetic recording apparatus according to an embodiment of the present invention.

FIG. 12 is a perspective view schematically showing the configuration of a major portion of such a magnetic recording apparatus. A magnetic recording apparatus 150 is of a type using a rotary actuator. In this figure, a magnetic disk 200 is installed on a spindle 152. The magnetic disk 200 is rotated in the direction of arrow A by a motor (not shown) that responds to control signals from a drive controller (not shown). The magnetic recording apparatus 150 according to the present invention may comprise a plurality of disks 200.

A head slider 153 is attached to the tip of a suspension 154 to read from and write to the magnetic disk 200. The head slider 153 has a magnetic head mounted near the tip thereof and including the magnetoresistive element according to any of the above embodiments.

When the magnetic disk 200 rotates, the air bearing surface (ABS) of head slider 153 is held so as to float on the surface of the magnetic disk 200 by a predetermined height. The head slider 153 may be of a so-called in-contact type contacting with the magnetic disk 200.

The suspension 154 is connected to one end of an actuator arm 155. A voice coil motor 156, a kind of linear motor, is provided on the other end of the actuator arm 155. The voice coil motor 156 is composed of a driving coil (not shown) wound around a bobbin on the other end of the actuator arm 155 and a magnetic circuit consisting of a permanent magnet and a counter yoke arranged opposite each other so as to sandwich the coil between the permanent magnet and the counter yoke.

The actuator arm 155 is held by ball bearings (not shown) provided at two vertical positions of the pivot 157. The actuator arm 155 can be rotatably slid by the voice coil motor 156.

Figure 13:
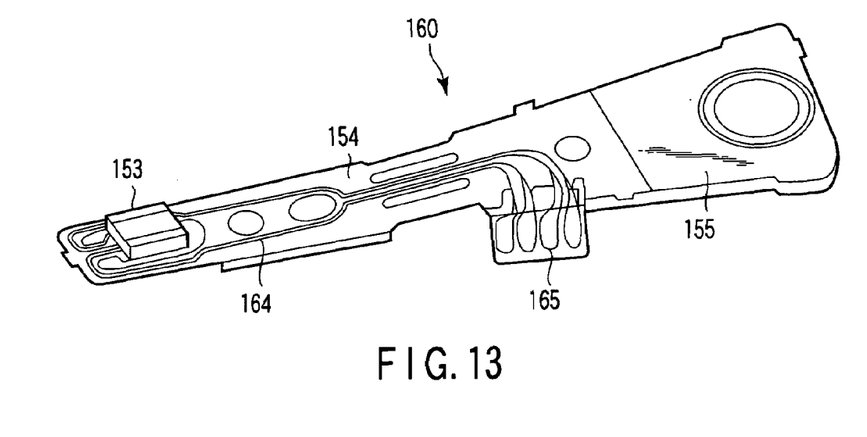
FIG. 13 is a perspective view of a magnetic head assembly according to an embodiment of the present invention.

FIG. 13 is an enlarged perspective view of a part of the magnetic head assembly including tip end side of the actuator arm 155, which is viewed from the disk. The magnetic head assembly 160 has the actuator arm 155, and the suspension 154 is connected to one end of the actuator arm 155.

The head slider 153 is attached to the tip of the suspension 154, and the head slider 153 comprises a magnetic head including the magnetoresistive element according to any of the above embodiments. The suspension 154 has leads 164 used to write and read signals. The leads 164 are electrically connected to respective electrodes in the magnetic head incorporated in the head slider 153. Reference numeral 165 in the figure denotes electrode pads of the magnetic head assembly 160.

The present invention comprises the magnetic head including the magnetoresistive element according to any of the above embodiments of the present invention. This makes it possible to reliably read information magnetically recorded on the magnetic disk 200 at a recording density higher than that in the prior art.

Now, a magnetic memory using the magnetoresistive element according to an embodiment of the present invention will be described. That is, the magnetoresistive element according to any of the above embodiments of the present invention makes it possible to provide a magnetic memory, for example, a magnetic random access memory (MRAM) in which memory cells are arrayed in a matrix.

Figure 14:
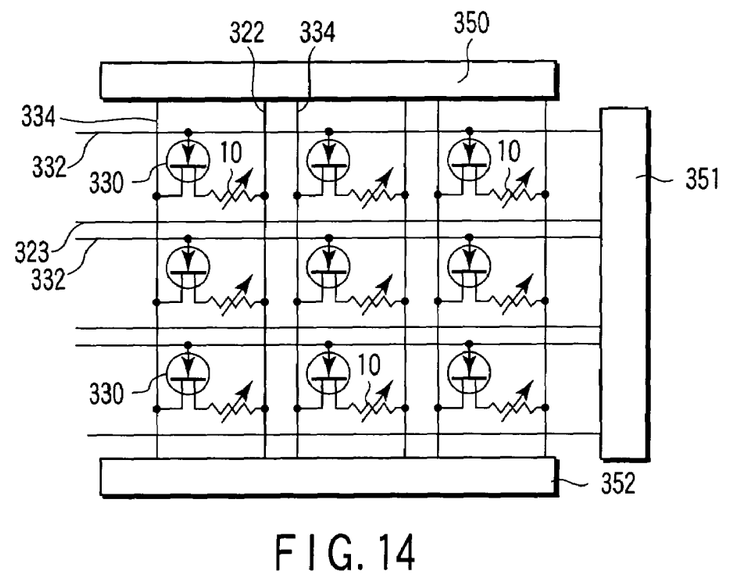
FIG. 14 is a diagram showing an example of the matrix configuration of a magnetic memory according to an embodiment of the present invention.

FIG. 14 is a diagram showing an example of the matrix configuration of a magnetic memory according to an embodiment of the present invention. This figure shows the circuit configuration in which memory cells are arrayed. The magnetic memory comprises a column decoder 350 and a row decoder 351 to select one bit in the array. A bit line 334 and a word line 332 are used to turn on and uniquely select a switching transistor 330. Detection by a sense amplifier 352 enables reading of the bit information recorded in the magnetic recording layer (free layer) in the magnetoresistive element 10. To write bit information, a current is passed through a particular word line 323 and a particular bit line 322 to generate a magnetic field to be applied.

Figure 15:
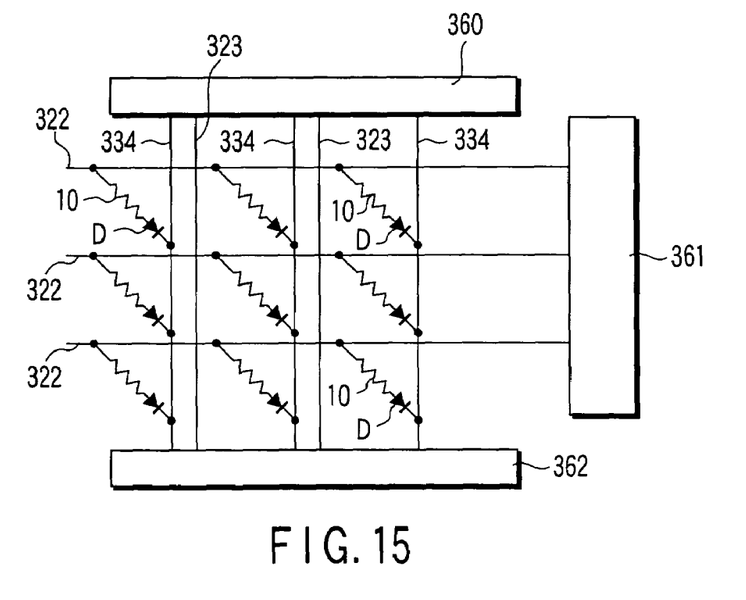
FIG. 15 is a diagram showing another example of the matrix configuration of a magnetic memory according to an embodiment of the present invention.

FIG. 15 is a diagram showing another example of the matrix configuration of a magnetic memory according to an embodiment of the present invention. In this case, one of bit lines 322 is selected by a decoder 361, while one of the word lines 334 is selected by a decoder 360; the bit lines 322 and the word lines 334 are arrayed in a matrix. Thus, a particular memory cell in the array is selected. Each memory cell has a structure in which the magnetoresistive element 10 and a diode D are connected in series. Here, the diode D serves to prevent a sense current from bypassing in the memory cells except the selected magnetoresistive element 10. A write operation is performed by using a magnetic field generated by passing a write current through each of a particular bit line 322 and a particular word line 323.

Figure 16:
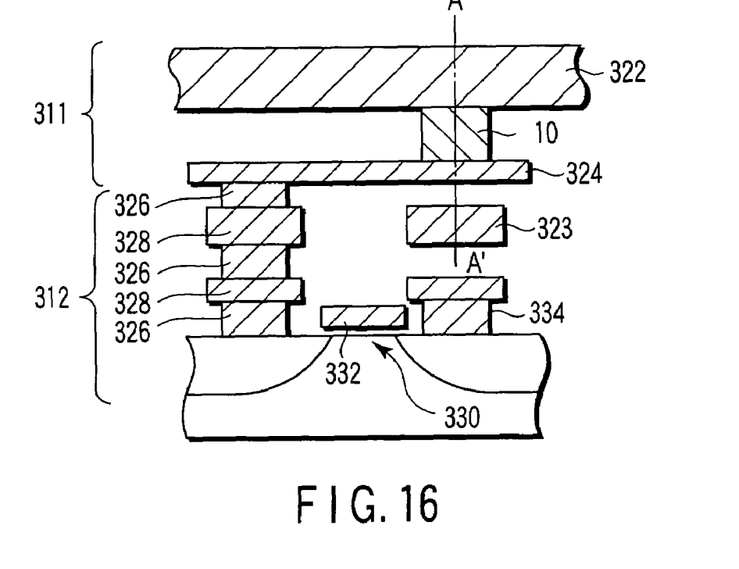
FIG. 16 is a sectional view showing a major portion of a magnetic memory according to an embodiment of the present invention.
Figure 17:
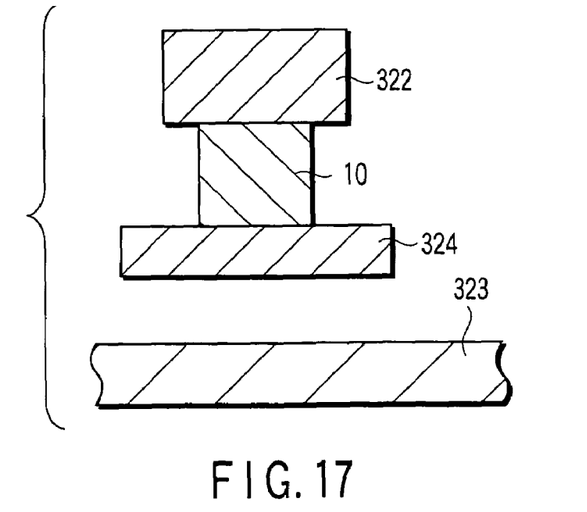
FIG. 17 is a sectional view of the magnetic memory taken along the line A-A' in FIG. 16.

FIG. 16 is a sectional view showing a major portion of a magnetic memory according to an embodiment of the present invention. FIG. 17 is a sectional view taken along the line A-A' in FIG. 16. The structure shown in these figures corresponds to a memory cell for one bit included in the magnetic memory shown in FIG. 14 or 15. The memory cell has a storage element 311 and an address selecting transistor 312.

The storage element 311 has the magnetoresistive element 10 and a pair of wires 322 and 324 connected to the magnetoresistive element 10. The magnetoresistive element 10 is any of the above embodiments.

On the other hand, the selecting transistor 312 is provided with a transistor 330 connected to the magnetoresistive element 10 through vias 326 and buried wires 328. The transistor 330 performs a switching operation in accordance with a voltage applied to a gate 332 to controllably open and close the current path between the magnetoresistive element 10 and a wire 334.

A write wire 323 is provided below the magnetoresistive element 10 in a direction orthogonal to the wire 322. The write wires 322 and 323 can be formed of, for example, aluminum (Al), copper (Cu), tungsten (W), tantalum (Ta), or an alloy of these elements.

In the memory configured as described above, to write bit information to the magnetoresistive element 10, a write pulse current is passed through the wires 322 and 323 to induce a synthetic field. The synthetic field is applied to appropriately reverse the magnetization of the recording layer of the magnetoresistive element.

Further, to read bit information, a sense current is passed through the wire 322, the magnetoresistive element 10 including the magnetic recording layer, and the lower electrode 324. Then, the resistance value or a resistance change of the magnetoresistive element 10 is measured.

The magnetic memory according to the embodiment of the present invention uses the magnetoresistive element according to any of the above embodiments. Consequently, even with a reduction in cell size, the magnetic domains in the recording layer are surely controlled to allow write and read operations to be reliably performed.

The embodiments of the present invention have been described with reference to the specific examples. However, the present invention is not limited to these specific examples. For example, for the specific structure of the magnetoresistive element as well as the shapes and materials of the electrodes, bias application film, insulating film, and the like, those skilled in the art can similarly implement the present invention to produce similar effects by making appropriate selections from the corresponding well-known ranges.

For example, when the magnetoresistive element is applied to a read magnetic head, the detection resolution of the magnetic head can be defined by providing magnetic shields on both sides of the element.

Further, the present invention can be applied to a magnetic head or magnetic recording apparatus based on a perpendicular magnetic recording system as well as a longitudinal magnetic recording system, and can produce similar effects in any system.

Moreover, the magnetic recording apparatus according to the present invention may be a so-called a rigid type constantly provided with particular recording media or a so-called "removable" type that allows recording media to be exchangeable.

The scope of the present invention also includes all the magnetoresistive elements, magnetic heads, magnetic recording apparatuses, and magnetic memories that can be implemented by those skilled in the art by appropriately changing the designs of the above magnetic heads and magnetic recording apparatuses described above as the embodiments of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element, comprising:
a first magnetic layer a magnetization direction of which is substantially pinned;
a second magnetic layer a magnetization direction of which varies depending on an external field;
a magnetic spacer layer provided between the first magnetic layer and the second magnetic layer and formed of a magnetic material with an antiferromagnetic spin alignment; and
electrodes which supply a current perpendicularly to a plane of a stacked film including the first magnetic layer, the magnetic spacer layer and the second magnetic layer,
the magnetization directions of the first and the second magnetic layers being substantially orthogonal at zero external field,
a spin direction of a region in the magnetic spacer layer close to the first magnetic layer being substantially orthogonal to a spin direction of a region in the magnetic spacer layer close to the second magnetic layer.

2. The magnetoresistive element according to claim 1, wherein the magnetic spacer layer is formed of a magnetic oxide selected from the group consisting of $\alpha$—$Fe_2O_3$, $\gamma$—$Fe_2O_3$, and spinel represented by $MFe_2O_4$ (where M is Fe, Go, Ni, Cu, Mn, Zn, Cr, or V).

3. The magnetoresistive element according to claim 2, wherein the magnetic spacer layer formed of the magnetic oxide has a thickness of 0.5 nm or more and 4 nm or less.

4. The magnetoresistive element according to claim 1, wherein the magnetic spacer layer is formed of a metal antiferromagnetic material represented as XMny (where X is Ir, Pt, Pd, Ru, Cr, Rh, or Re y$\geq$30 atomic %).

5. The magnetoresistive element according to claim 4, wherein the magnetic spacer layer formed of the metal antiferromagnetic material has a thickness of 1 nm or more and 10 nm or less.

6. The magnetoresistive element according to claim 1, wherein the magnetic spacer layer includes a region with an even number of atomic layers and a region with an odd number of atomic layers.

7. A magnetic head comprising the magnetoresistive element according to claim 1.

8. A magnetic recording apparatus comprising a magnetic recording media and the magnetic head according to claim 7.

9. A magnetic memory comprising the magnetoresistive element according to claim 1.

10. A magnetoresistive element comprising:
a first magnetic layer a magnetization direction of which is substantially pinned;
a second magnetic layer a magnetization direction of which varies depending on an external field;
a magnetic spacer layer provided between the first magnetic layer and the second magnetic layer and having a magnetic oxide with an antiferromagnetic spin alignment and bridge sections formed of a metal ferromagnetic material penetrating the magnetic oxide; and
electrodes which supply a current perpendicularly to a plane of a stacked film including the first magnetic layer, the magnetic spacer layer and the second magnetic layer,
the magnetization directions of the first and the second magnetic layers being substantially orthogonal at zero external field.

11. The magnetoresistive element according to claim 10, wherein the magnetic oxide in the magnetic spacer layer is formed of a magnetic oxide selected from the group consisting of $\alpha$—$Fe_2O_3$, $\gamma$—$Fe_2O_3$, and spinel represented by $MFe_2O_4$ (where M is Fe, Co, Ni, Cu, Mn, Zn, Cr, or V), and the bridge sections in the magnetic spacer layer are formed of a metal ferromagnetic material containing at least one element selected from the group consisting of Fe, Co and Ni.

12. The magnetoresistive element according to claim 11, wherein the magnetic spacer layer has a thickness of 0.5 nm or more and 4 nm or less.

13. The magnetoresistive element according to claim 10, wherein a size of the bridge sections in a plane of the magnetic spacer layer is 5 nm or more and 10 nm or less.

14. The magnetoresistive element according to claim 10, wherein an area ratio of the bridge sections in a plane of the magnetic spacer layer is 1% or more and 30% or less.

15. A magnetoresistive element, comprising:
a first magnetic layer a magnetization direction of which is substantially pinned;
a second magnetic layer a magnetization direction of which varies depending on an external field;
a magnetic spacer layer provided between the first magnetic layer and the second magnetic layer and formed of a magnetic material with an antiferromagnetic spin alignment; and
electrodes which supply a current perpendicularly to a plane of a stacked film including the first magnetic layer, the magnetic spacer layer and the second magnetic layer, wherein
spin directions in the magnetic spacer are twisted gradually to about 90° from a region in the magnetic spacer close to the first magnetic layer to a region in the magnetic spacer close to the second magnetic layer.

* * * * *